Nov. 5, 1963 P. L. MERETSKY 3,109,221

SEMICONDUCTOR DEVICE

Filed Aug. 19, 1958

INVENTOR.
PAUL L. MERETSKY

BY

Francis L. Masselle

ATTORNEY 3,109,221
Patented Nov. 5, 1963

3,109,221

SEMICONDUCTOR DEVICE

Paul L. Meretsky, Framingham, Mass., assignor to Clevite Corporation, Cleveland, Ohio, a corporation of Ohio Filed Aug. 19, 1958, Ser. No. 755,914
2 Claims. (Cl. 29—25.3)

This invention relates to semiconductor devices, particularly alloyed junction transistors, and to methods and apparatus for fabricating same.

The conventional method of forming alloy junctions involves the use of a fixture or jig commonly referred to as a "boat." The usual component parts of the transistor assembly, consisting of the semiconductor wafer, the emitter and collector pellets, the base ring and the base tab are disposed in the boat and alloyed or soldered, as the case may be, in various combinations and sequences. Thus, for example, the emitter, collector and base ring may be alloyed and the base tab soldered all in one operation or the emitter, collector and base ring may be alloyed at one time and the base tab soldered subsequently.

Various additional alloying and soldering schedules which are possible and to which the present invention has particular application are as follows:

I (1) Alloy collector
(2) Alloy emitter and base ring
(3) Solder base tab

II (1) Alloy collector
(2) Alloy emitter and solder base tab

While the use of alloying boats is an accepted technique in the art, it entails disadvantages which would render elimination of the need for boats highly desirable. A primary difficulty encountered with alloying fixtures is the tendency of the alloying materials to wet the surfaces of the boat, with consequent sticking; this makes removal of the alloyed unit difficult and liable to damage in the process. Another disadvantage of alloying fixtures is their relative complexity which makes them comparatively expensive and, in conjunction with their small size, creates an assembly process which is slow, tedious and requires considerable manual dexterity.

The present invention contemplates a solution to these and other problems of alloying fixtures by providing a method of transistor fabrication which does not entail the use of an alloying boat, as such. More specifically, a method of fabricating alloyed transistors according to the invention includes using a base tab for an alloying jig.

Additional features of the invention relate to particular transistor configurations including a base tab in which the transistor is alloyed and to apparatus for alloying transistors which apparatus becomes a unitary part of the transistor.

It is a fundamental object of the invention to overcome at least one of the problems of the prior art relating to alloyed semiconductor devices.

A more particular object is the provision of novel methods for alloying transistors which do not involve the use of alloying fixtures, as such.

Another object is to provide novel methods and apparatus for alloying transistors which are simpler, less expensive, and involve less risk of damage to the product than prior art methods and apparatus.

These and further objects of the invention, its advantages, scope, and the manner in which it is practiced will be apparent to those conversant with the art from the following description and subjoined claims taken in conjunction with the annexed drawings in which like numerals of reference designate like parts throughout the several views and in which FIGURE 1 is a top plan view of apparatus in accordance with the invention, viz., a combined base tab and alloying fixture;

Figure 1:
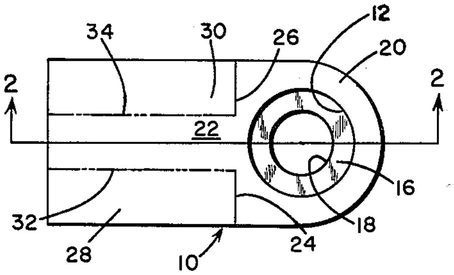
Figure 2:
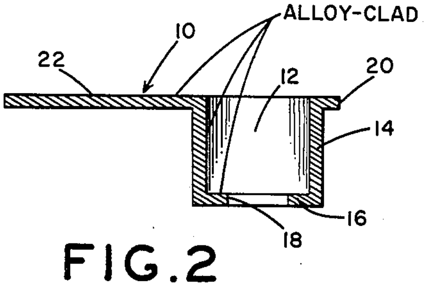
FIGURE 2 is a sectional view on line 2—2 of FIGURE 1 looking in the direction of the arrows.

Referring now to FIGURES 1 and 2 there is illustrated a combined base tab-alloying jig designated in its entirety by reference numeral 10. As previously mentioned and hereinafter explained in detail element 10 may be regarded as an alloying jig or boat inasmuch as it functions as such; however, the elementh becomes a unitary part, viz., the base tab of the transistor and, in this respect it may be referred to as the base tab. In any event, whichever nomenclature is employed in this description and the subjoined claims, it is intended to embrace both aspects of the element.

Element 10 is a thin metallic member, generally rectangular in shape in its plan view. Adjacent one end, element 10 is formed with a cylindrical or cup-shape depression 12 bounded by a sidewall 14 and having a bottom 16 containing a concentric opening 18 which gives the bottom of the depression the form of an inwardly extending annular flange or shoulder. The upper end of depression 12 is surrounded by a radial flange 20 extending outwardly from sidewall 14. On one side of depression 12, flange 20 has a generally rectangular extension or tang 22 having a pair of transverse, aligned cuts or slits 24, 26 each extending approximately ⅓ the width of the tang from a respective edge thereof. Thus a pair of longitudinal edge regions 28, 30 of extension 22 are transversely severed from flange 22. The longitudinal inner boundary of regions 28, 30 is marked in FIGURE 1 by broken lines 32 and 34, respectively. If necessary or desired extension 22 may be scored to facilitate bending along lines 32, 34. The purpose of cuts 24, 26 and regions 28, 30 will become apparent as this description proceeds.

Inasmuch as the method herein described involves inverting element 10 it is pointed out that for literary ease and clarity of reference, the position of element 10 as shown in FIGURE 2 will be considered as its upright position and all relative designations (e.g., top, bottom, etc.) will be referred to and reckoned from this position.

Having provided a base tab element 10 having a depression 12 and a central aperture 18 in the bottom 16 of the depression, the element is suitably tinned. Alternatively, element 10 may be fabricated of a pre-clad material, i.e., having one surface coated with a tin-antimony alloy, for example, thus eliminating the need for tinning. In FIGURE 2, the alloy-clad surfaces are so designated.

Figure 3:
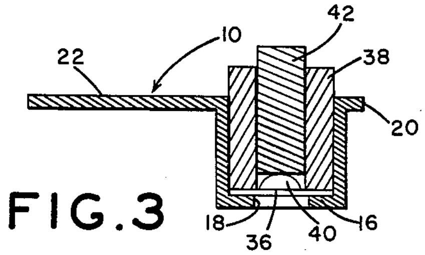
FIGURE 3 is a view similar to FIGURE 2 showing various component parts of a transistor in production, with additional pieces of apparatus in position, at an initial stage of fabrication.

At the start of the assembly procedure, element 10 is fixed or supported in its upright position by any suitable means. Preferably, this is accomplished by placing tang 22 in a clamp, not illustrated. As shown in FIGURE 3, a wafer 36 of semiconductive material such as germanium or silicon is disposed in depression 12 where it is supported by bottom flange 16. Thereafter, a tubular member 38, known as a "plug" is inserted into the depression so as to rest upon the upper surface of wafer 36. Tubular member 38 is dimensioned to fit easily into the depression; the inner diameter of member 38 adapts it to rest upon a peripheral portion of wafer 36 leaving a central region unobstructed.

An alloying element or pellet 40, is dropped through plug 38 and comes to rest on the exposed central portion of wafer 36. Thereafter, a cylindrical member 42, known as a "pin," dimensioned to fit easily into the bore of plug 38, is disposed therein so as to rest upon the alloying element 40. While the sequence of certain of the operations involved in the method may be varied, it will be assumed that the collector is alloyed first; therefore element 40 would be the collector pellet.

The assembly, in the condition shown in FIGURE 3, is placed in an alloying furnace at proper temperature for the requisite period of time to effect alloying of button 40 to wafer 36 and, simultaneously, soldering of the wafer to base tab 10 in the position shown.

Figure 4:
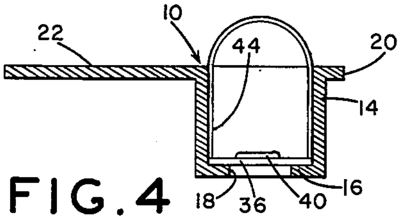

After the assembly has been removed from the furnace and cooled, pin 42 and plug 38 are removed and replaced by a U-bend 44 inserted into depression 12 so that the legs of the U bear resiliently outward against the sidewall 14 of the depression and the ends of the legs abut wafer 36. At this stage the assembly appears as shown in FIGURE 4.

Figure 5:
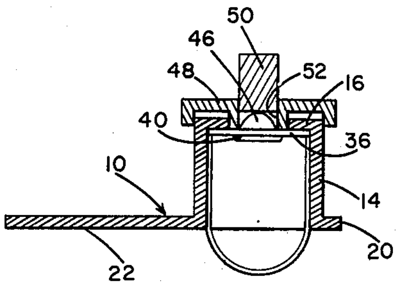
FIGURES 4 and 5 are views similar to FIGURES 2 and 3 showing progressive stages of fabrication.

The next step of the method entails inverting the assembly and supporting it in the position shown in FIGURE 5. An alloying element, i.e., emitter pellet 46, then is placed on the bottom surface of wafer 36 which is now uppermost and accessible through opening 18 in the bottom 16 of depression 12.

A cap plug member 48 and pin 50 are provided to position emitter button 46 during alloying. To this end, cap plug 48 contains a shallow cylindrical recess on its under surface which is adapted to slidably coaxially receive the outer sidewall of depression 12. Cap plug 48 contains a central aperture 52 which establishes the location of the emitter button 46. With the cap plug in position as shown in FIGURE 5, the emitter pellet, inserted through aperture 52, is placed on the wafer 36. Pin 50 then is inserted into the aperture and rests upon the emitter pellet.

The assembly as shown in FIGURE 5 is returned to the alloying furnace to effect alloying of emitter button 46 to wafer 36. During this operation, the temperatures required are above the melting point of the solder used to secure the wafer in the base tab but U-bend 44 prevents its becoming displaced.

Figure 6:
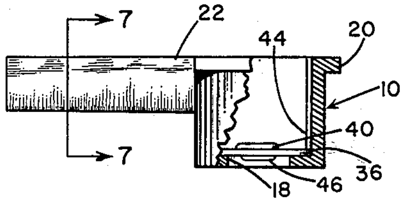
FIGURE 6 is a side elevational view, partially in section, of a complete transistor in accordance with the invention.
Figure 7:
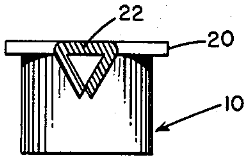
FIGURE 7 is a partial sectional view taken on line 7—7 of FIGURE 6, looking in the direction of the arrows.

After completion of the alloying steps, the loop or bight of the U-bend 44 is cut off flush with flange 20 and the side regions 28, 30 (FIGURE 1) of extension 22 are bent downwardly and inwardly along lines 32, 34 to form a triangular receptacle (best shown in FIGURE 7) for the attachment of a lead wire (not shown). The final appearance of the unit can best be appreciated by reference to FIGURE 6.

It will be understood that the order of the steps of the method can be modified. Thus the emitter rather than the collector can be alloyed first; also the soldering of the base tab can be accomplished separately from the alloying steps.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

I claim:

1. A method of fabricating alloyed semiconductor devices which includes the steps of: forming a base tab having a depression therein and an aperture in the bottom of the depression; positioning a semiconductor wafer in the bottom of the depression; inserting an elongated plug having a central bore into the depression to rest upon the upper central surface of the wafer and weight the wafer down against the bottom of the depression; inserting an alloying element into the bore of the plug whereby the alloying element rests upon the upper central surface of the wafer; inserting an elongated pin into the bore of the plug to engage and weight the alloying element down against the upper central surface of the wafer; heating the assembly thus obtained to alloy said alloying element to the upper central surface of the wafer and to simultaneously solder the wafer in the depression; removing the plug and pin; inverting the base tab; positioning a second plug, having a central bore, in said aperture to rest upon the opposite central surface of the wafer; inserting a second alloying element in the bore of the second plug; inserting a second elongated pin into the bore of the second plug to engage and weight the second alloying element down against said opposite central surface of the wafer; heating the assembly thus obtained to alloy said second alloying element to said opposite central surface while simultaneously maintaining the wafer against displacement; and removing the second plug and second pin.

2. A method of fabricating alloyed semiconductor devices which includes the steps of: forming a base tab having a depression therein and an aperture in the bottom of the depression; positioning a semiconductor wafer in the bottom of the depression; inserting an elongated plug having a central bore into the depression to engage and maintain the wafer in intimate physical contact with the bottom of the depression; inserting an alloying element into the bore of the plug whereby the alloying element rests upon the upper central surface of the wafer; inserting an elongated pin into the bore of the plug to engage and maintain the alloying element in intimate physical contact with the upper surface of the wafer; heating the assembly thus obtained to alloy the alloying element to the upper central surface of the wafer and to simultaneously solder the wafer in the depression; removing the plug and pin; inserting a retaining device into the depression to maintain the wafer against displacement; inverting the base tab; positioning a second plug having a central bore in said aperture to rest upon the opposite central surface of the wafer; inserting a second alloying element in the bore of the second plug; inserting a second elongated pin in the bore of the second plug to engage and maintain the second alloying element in intimate physical contact with said opposite surface of the wafer; heating the assembly thus obtained to alloy the second alloying element to said opposite surface of the wafer; and removing the second plug and pin and the retaining device.

References Cited in the file of this patent

UNITED STATES PATENTS

| | | |
|---|---|---|
| 2,813,326 | Liebowitz | Nov. 19, 1957 |
| 2,836,878 | Shepard | June 3, 1958 |
| 2,842,723 | Koch et al. | July 8, 1958 |
| 2,849,664 | Beale | Aug. 26, 1958 |
| 2,900,287 | Bestler et al. | Aug. 18, 1959 |
| 2,913,642 | Jenny | Nov. 17, 1959 |
| 2,942,568 | Hamilton et al. | June 28, 1960 |
| 2,962,639 | Pensak | Nov. 29, 1960 |